(12) United States Patent
Tapily et al.

(10) Patent No.: US 11,443,953 B2
(45) Date of Patent: Sep. 13, 2022

(54) METHOD FOR FORMING AND USING STRESS-TUNED SILICON OXIDE FILMS IN SEMICONDUCTOR DEVICE PATTERNING

(71) Applicant: Tokyo Electron Limited, Tokyo (JP)

(72) Inventors: Kandabara N. Tapily, Albany, NY (US); Anton deVilliers, Albany, NY (US); Gerrit J. Leusink, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/682,607

(22) Filed: Nov. 13, 2019

(65) Prior Publication Data

US 2020/0152473 A1   May 14, 2020

Related U.S. Application Data

(60) Provisional application No. 62/760,222, filed on Nov. 13, 2018.

(51) Int. Cl.
*H01L 21/31* (2006.01)
*H01L 21/469* (2006.01)
(Continued)

(52) U.S. Cl.
CPC .. *H01L 21/31116* (2013.01); *H01L 21/02164* (2013.01); *H01L 21/02211* (2013.01)

(58) Field of Classification Search
CPC ......... H01L 21/31116; H01L 21/02164; H01L 21/02211; H01L 29/7843; H01L 33/12; H01L 29/7847

(Continued)

(56) References Cited

U.S. PATENT DOCUMENTS 7,993,457 B1 * 8/2011 Krotov .............. C23C 16/45544
                                                        118/719
10,522,395 B1 * 12/2019 Light .................. H01L 21/0338
(Continued)

FOREIGN PATENT DOCUMENTS

| KR | 10-0510464 B1 | 10/2005 |
| KR | 10-2011-0139107 A | 12/2011 |
| WO | 2010-059441 A2 | 5/2010 |

OTHER PUBLICATIONS

Korean Intellectual Property Office, International Search Report and Written Opinion for International application No. PCT/US2019/061183, dated Mar. 19, 2020, 9 pages.

*Primary Examiner* — Calvin Y Choi

(57) ABSTRACT

A processing method includes receiving a substrate containing a base layer having a mandrel pattern formed thereon containing a number of features, conformally depositing a silicon oxide film over the mandrel pattern by coating surfaces of the substrate with a metal-containing catalyst layer, and in the absence of any oxidizing and hydrolyzing agent, exposing the substrate to a process gas containing a silanol gas at a substrate temperature selected to yield a preferred level of stress in the silicon oxide film. The method further includes removing the silicon oxide film from upper surfaces of the mandrel pattern and lower surfaces adjacent the mandrel pattern to leave behind silicon oxide sidewall spacers on sidewalls of the mandrel pattern, and removing the mandrel pattern from the substrate to leave behind the silicon oxide sidewall spacers that form a new pattern having double the number of features of the removed mandrel pattern.

20 Claims, 7 Drawing Sheets

(51) Int. Cl.
*H01L 21/311* (2006.01)
*H01L 21/02* (2006.01)

(58) Field of Classification Search
USPC .......................................................... 438/787
See application file for complete search history.

(56) References Cited

U.S. PATENT DOCUMENTS

| | | | |
|---|---|---|---|
| 2006/0038293 A1* | 2/2006 | Rueger | H01L 23/53295 |
| | | | 257/751 |
| 2007/0122966 A1* | 5/2007 | Hoentschel | H01L 29/6653 |
| | | | 438/231 |
| 2011/0312192 A1 | 12/2011 | Murakami et al. | |
| 2016/0247680 A1 | 8/2016 | O'Meara et al. | |
| 2016/0319427 A1 | 11/2016 | Arora et al. | |
| 2016/0365425 A1* | 12/2016 | Chen | H01L 21/02178 |

\* cited by examiner

METHOD FOR FORMING AND USING STRESS-TUNED SILICON OXIDE FILMS IN SEMICONDUCTOR DEVICE PATTERNING

CROSS-REFERENCE TO RELATED APPLICATIONS

This application is related to and claims priority to U.S. Provisional Patent Application Ser. No. 62/760,222, filed on Nov. 13, 2018, the entire contents of which are herein incorporated by reference.

FIELD OF THE INVENTION

The present invention relates to semiconductor manufacturing, and more particularly to a method for forming and using stress-tuned silicon oxide films as sidewall spacers in semiconductor device patterning.

BACKGROUND OF THE INVENTION

Spacer patterning is a technique employed for patterning features with linewidths smaller than can be achieved by conventional lithography. In the most general sense, a spacer is a layer that is deposited over a pre-patterned feature, often called the mandrel. The spacer is subsequently etched back so that the spacer portion covering the mandrel is etched away while the spacer portion on the sidewall remains. The mandrel may then be removed, leaving two spacers (one for each edge) for each mandrel. This is commonly referred to as Self-Aligned Double Patterning (SADP). The spacers may be further trimmed to narrower widths, especially to act as mandrels for a subsequent second spacer formation. When SADP is repeated, an additional halving of the pitch is achieved. This is often referred to as Self-Aligned Quadruple Patterning (SAQP). The repeating may be performed multiple times and is commonly referred to as Self-Aligned Multiple Patterning (SAMP).

SUMMARY OF THE INVENTION

Embodiments of the invention describe a method for forming and using stress-tuned silicon oxide films as sidewall spacers in semiconductor device patterning. According to one embodiment, the method includes receiving a substrate containing a base layer having a mandrel pattern formed thereon containing a number of features, conformally depositing a silicon oxide film over the mandrel pattern by coating surfaces of the substrate with a metal-containing catalyst layer, and in the absence of any oxidizing and hydrolyzing agent, exposing the substrate to a process gas containing a silanol gas at a substrate temperature that is selected to yield a preferred level of stress in the silicon oxide film. The method further includes removing the silicon oxide film from upper surfaces of the mandrel pattern and lower surfaces adjacent the mandrel pattern to leave behind silicon oxide sidewall spacers on sidewalls of the mandrel pattern, and removing the mandrel pattern from the substrate to leave behind the silicon oxide sidewall spacers that form a new pattern having double the number of features of the removed mandrel pattern. The method can further include transferring the new pattern into the base layer, and removing the silicon oxide sidewall spacers from the substrate.

According to one embodiment, the method includes receiving a substrate containing a base layer having a mandrel pattern formed thereon containing a number of features, conformally depositing a silicon oxide film over the mandrel pattern by coating surfaces of the substrate with a metal-containing catalyst layer, and in the absence of any oxidizing and hydrolyzing agent, exposing the substrate to a process gas containing a silanol gas at a substrate temperature that is selected to yield a preferred level of stress in the silicon oxide film. The method further includes removing the silicon oxide film from upper surfaces of the mandrel pattern and lower surfaces adjacent the mandrel pattern to leave behind silicon oxide sidewall spacers on sidewalls of the mandrel pattern, and removing the mandrel pattern from the substrate to leave behind the silicon oxide sidewall spacers that form a new pattern having double the number of features of the removed mandrel pattern. The method further includes conformally depositing a metal oxide film on the new pattern, removing the metal oxide film from upper surfaces of the new pattern and lower surfaces adjacent the new pattern to leave behind metal oxide sidewall spacers on sidewalls of the new pattern, and removing the silicon oxide sidewall spacers from the substrate to leave behind the metal oxide sidewall spacers that form a second new pattern having double the number of features of the removed new pattern. The method can further include transferring the new pattern into the base layer, and removing the metal oxide sidewall spacers from the substrate.

According to another embodiment, the method includes receiving a substrate containing a base layer having a mandrel pattern formed thereon comprising a number of features, conformally depositing a silicon oxide film over the mandrel pattern by coating surfaces of the substrate with a metal-containing catalyst layer, and in the absence of any oxidizing and hydrolyzing agent, exposing the substrate to a process gas containing a silanol gas at a substrate temperature that is selected to yield a preferred level of stress in the silicon oxide film. The method further includes conformally depositing a metal oxide film on the silicon oxide film, removing the metal oxide film and the silicon oxide film from upper surfaces of the mandrel pattern and lower surfaces adjacent the mandrel pattern to leave behind metal oxide sidewall spacers and silicon oxide sidewall spacers on sidewalls of the mandrel pattern, and removing the mandrel pattern from the substrate to leave behind the metal oxide sidewall spacers and the silicon oxide sidewall spacers that form a new pattern having double the number of features of the removed mandrel pattern. The method can further include transferring the new pattern into the base layer, and removing the metal oxide sidewall spacers and silicon oxide sidewall spacers from the substrate.

DETAILED DESCRIPTION OF SEVERAL EMBODIMENTS

Figure 1A:
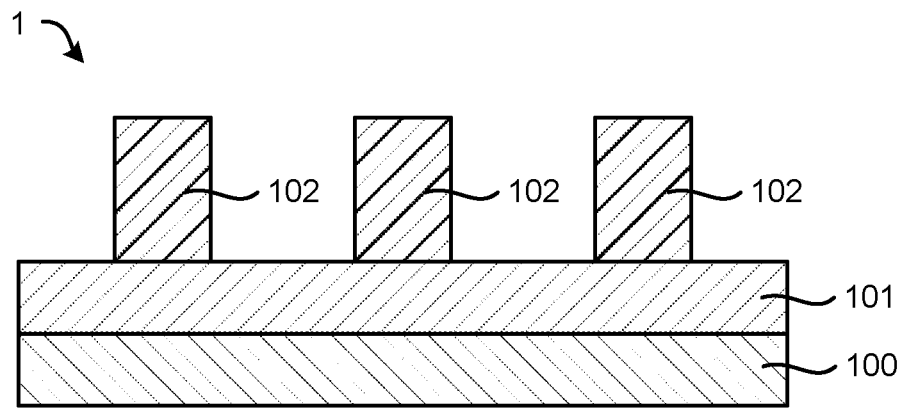
FIGS. 1A-1F schematically show through cross-sectional views a method of processing a substrate according to an embodiment of the invention.

Embodiments of the invention describe a method for forming and using stress-tuned silicon oxide films as sidewall spacers in semiconductor device patterning. Tuning control over many material properties of sidewall spacers is required to improve spacer patterning for increasingly smaller feature sizes. Key challenges in semiconductor device patterning is built-in stress from stacking various materials layers on a substrate and material properties of sidewall spacers formed on the material layers. Embodiments of the invention describe a method for tuning the physical stress of silicon oxide films used as sidewall spacers, where the physical stress can affect etch selectivity relative to other materials on the substrate, line-edge roughness (LER), line-width roughness (LWR), and overall pattern transfer. This includes straighter vertical profiles of the sidewall spacers which allows for improved pattern transfer to layers underneath the sidewall spacers. Further, stress-tuning of silicon oxide films may be used to affect physical stress of other films deposited on the silicon oxide films.

Embodiments of the invention provide a substrate processing method that includes a sequence of processing steps that include receiving a substrate into a manufacturing platform, the substrate having a mandrel pattern formed thereon containing a number of features, and conformally applying a thin film over the mandrel pattern in a film-forming module. The integrated sequence of processing steps further includes removing the thin film from upper surfaces of the mandrel pattern and lower surfaces adjacent the mandrel pattern in an etching module to leave behind the thin film on sidewalls of the mandrel pattern, thereby forming sidewall spacers, removing the mandrel pattern from the substrate in an etching module to leave behind the sidewall spacers, where the sidewall spacers form a new pattern having multiples of the number of features of the removed mandrel pattern, and optionally, using the new pattern as another mandrel pattern and repeating one or more times the processing steps of conformally applying a thin film, removing the thin film, and removing the mandrel pattern, wherein each repetition doubles the number of features. According to some embodiments, the thin film can include silicon oxide, metal-doped silicon oxide, or a laminate structure containing alternating films of silicon oxide and a metal oxide.

As used herein, the term "substrate" means and includes a base material or construction upon which materials are formed. It will be appreciated that the substrate may include a single material, a plurality of layers of different materials, or a layer or layers having regions of different materials or different structures in them. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may include a stack of various materials that have been subjected to a lithographic process in which a resist is coated onto a substrate and exposed to make the mandrel pattern. The resist pattern is then transferred to the underlying layers through a succession of etching steps. To those familiar in the current art, different schemes are known for creating a mandrel pattern on a substrate, which mandrels may be organic mandrels or hard mandrels, including such materials as silicon, amorphous carbon, photoresist polymer, oxide, nitride, or the like. One such scheme involves deposition of an optical or organic planarizing layer (OPL), typically a spin-on material, then deposition of a silicon anti-reflective coating (SiARC), also spin-on, followed by resist coating and lithographic processes. Another scheme involves deposition of an amorphous carbon layer using chemical vapor deposition (CVD), then SiON film deposition using a CVD process, then bottom anti-reflective coating (BARC) deposition using a spin-on process, followed by a resist coating and lithographic processes.

FIGS. 1A-1F schematically show through cross-sectional views a method of processing a substrate according to an embodiment of the invention. Referring now to FIG. 1A, the method includes receiving a substrate 1 containing a base material 100 and base layer 101 having a mandrel pattern 102 formed thereon containing a number of features. For simplicity, the substrate 1 is depicted with a base layer 101 thereon into which a final pattern is to be transferred, and the mandrel pattern 102 is formed on the base layer 101, although it may be understood that the structure on which the mandrel pattern 102 is formed may be a multi-layer structure of which the base layer 101 is just one of multiple layers. The features of the mandrel pattern 102 contain horizontal and vertical surfaces (i.e., sidewalls) that may be created using standard photolithographic techniques and etching techniques, as known to those of ordinary skill in the art.

The base layer 101 can include a conductive layer, a non-conductive layer, or a semi-conductive layer. For instance, the base layer 101 may include at least one material layer comprising a silicon-containing material, such as polysilicon, silicon dioxide, silicon nitride, silicon carbide, or silicon oxynitride. The base layer 101 may contain a dielectric layer, including a low dielectric constant layer (i.e., low-k) or an ultra-low dielectric constant (i.e., ultra-low-k) layer having a nominal dielectric constant value that is less than the dielectric constant of $SiO_2$, which is approximately 4 (e.g., the dielectric constant for thermal silicon dioxide ranges from about 3.8 to about 3.9). The dielectric layer may include at least one of an organic, inorganic, or inorganic-organic hybrid material. Additionally, the dielectric layer may be porous or non-porous. For example, the dielectric layer may include a silicate-based material, such as carbon doped silicon oxide (or organosiloxane), deposited using CVD. Alternatively, the dielectric layer may include porous inorganic-organic hybrid films comprised of a single-phase, such as a silicon oxide-based matrix having $CH_3$ bonds that hinder full densification of the dielectric layer during a curing or deposition process to create small voids (or pores). Still alternatively, the dielectric layer may include porous inorganic-organic hybrid films comprised of at least two phases, such as a carbon-doped silicon oxide-based matrix having pores of organic material (e.g., porogen) that is decomposed and evaporated during a curing process. Still alternatively, the dielectric layer may include an inorganic, silicate-based material, such as hydrogen silsesquioxane (HSQ) or methyl silsesquioxane (MSQ), deposited using a spin-on dielectric (SOD) technique. Still alternatively, the dielectric layer may comprise an organic material deposited using an SOD technique.

Figure 1B:
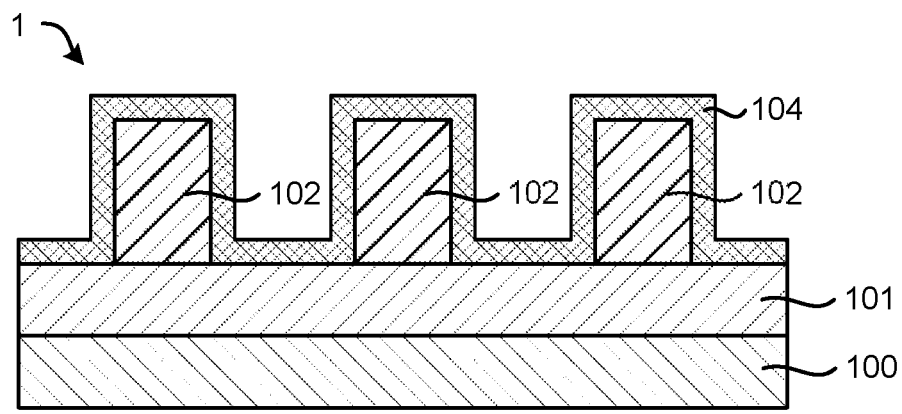

Referring to FIG. 1B, the method further includes conformally depositing a silicon oxide film 104 over the mandrel pattern 102 by coating surfaces of the substrate 1 with a metal-containing catalyst layer, and thereafter exposing the substrate 1 to a process gas containing a silanol gas in the absence of any oxidizing and hydrolyzing agent at a substrate temperature that is selected to yield a preferred level of stress in the silicon oxide film 104. The coating and exposing steps may be sequentially performed in the absence of a plasma with no temporal overlap. The gentle processing conditions reduce or eliminate etching or damaging sensitive mandrel materials such as amorphous carbon, photoresist polymer, and others.

The step of coating surfaces of the substrate with a metal-containing catalyst layer can include exposing the substrate 1 to a gas pulse containing a metal to adsorb the metal-containing catalyst layer on surfaces of the substrate 1. The metal may react on the surface of the substrate 1 to form a chemisorbed layer that is less than a monolayer thick. In one example, the metal-containing catalyst layer may include a metal-containing precursor, e.g., $AlMe_3$. Each gas pulse may include a respective purge or evacuation step to remove unreacted gas or byproducts from the film deposition module.

Examples of metal-containing catalyst layers include layers that contain aluminum (Al), titanium (Ti), or both aluminum and titanium. According to one embodiment, the metal-containing catalyst layer is selected from the group consisting of Al, $Al_2O_3$, AlN, AlON, an Al-containing precursor, Al-alloys, CuAl, TiAlN, TaAlN, Ti, TiAlC, $TiO_2$, TiON, TiN, a Ti-containing precursor, Ti-alloys, a Hf containing precursor, a Zr-containing precursor, and combinations thereof.

Embodiments of the invention may utilize a wide variety of Al-containing precursors. For example, many aluminum precursors have the formula: $AlL_1L_2L_3D_x$
where $L_1$, $L_2$, $L_3$ are individual anionic ligands, and D is a neutral donor ligand where x can be 0, 1, or 2. Each $L_1$, $L_2$, $L_3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles. Other examples of aluminum precursors include: $AlMe_3$, $AlEt_3$, $AlMe_2H$, $[Al(O^sBu)_3]_4$, $Al(CH_3COCHCOCH_3)_3$, $AlCl_3$, $AlBr_3$, $AlI_3$, $Al(O^iPr)_3$, $[Al(NMe_2)_3]_2$, $Al(^tBu)_2Cl$, $Al(Bu)_3$, $Al(^tBu)_2H$, $AlEt_2Cl$, $Et_3Al_2(O^sBu)_3$, and $Al(THD)_3$. Embodiments of the invention may utilize a wide variety of Ti-containing precursors. Examples include Ti-containing precursors having "Ti—N" intra-molecular bonds include $Ti(NEt_2)_4$ (TDEAT), $Ti(NMeEt)_4$ (TEMAT), $Ti(NMe_2)_4$ (TDMAT). Other examples include Ti-containing precursors containing "Ti—C" intra-molecular bonds include $Ti(COCH_3)(\eta 5\text{-}C_5H_5)_2Cl$, $Ti(\eta 5\text{-}C_5H_5)Cl_2$, $Ti(\eta 5\text{-}C_5H_5)Cl_3$, $Ti(\eta 5\text{-}C_5H_5)_2Cl_2$, $Ti(\eta 5\text{-}C_5(CH_3)_5)Cl_3$, $Ti(CH_3)(\eta 5\text{-}C_5H_5)_2Cl$, $Ti(\eta 5\text{-}C_5H_7)_2Cl_2$, $Ti(\eta 5\text{-}C_5(CH_3)_5)_2Cl$, $Ti(\eta 5\text{-}C_5(CH_3)_5)_2Cl_2$, $Ti(\eta 5\text{-}C_5H_5)_2(\mu\text{-}Cl)_2$, $Ti(\eta 5\text{-}C_5H_5)_2(CO)_2$, $Ti(CH_3)_3(\eta 5\text{-}C_5H_5)$, $Ti(CH_3)_2(\eta_5\text{-}C_5H_5)_2$, $Ti(CH_3)_4$, $Ti(\eta 5\text{-}C_5H_5)(\eta 7\text{-}C_7H_7)$, $Ti(\eta 5\text{-}C_5H_5)(\eta 8\text{-}C_8H_8)$, $Ti(C_5H_5)_2(\eta 5\text{-}C_5H_5)_2$, $Ti((C_5H_5)_2)_2(\eta\text{-}H)_2$, $Ti(\eta 5\text{-}C_5(CH_3)_5)_2$, $Ti(\eta 5\text{-}C_5(CH_3)_5)_2(H)_2$, and $Ti(CH_3)_2(\eta 5\text{-}C_5(CH_3)_5)_2$. $TiCl_4$ is an example of a titanium halide precursor containing a "Ti-halogen" bond.

In some examples, the silanol gas may be selected from the group consisting of tris(tert-pentoxy) silanol (TPSOL), tris(tert-butoxy) silanol, and bis(tert-butoxy)(isopropoxy) silanol. However, other silanol gases are contemplated and may be used.

The thickness of the conformal silicon oxide film 104 is controlled by self-limiting adsorption of the silanol gas on the metal-containing catalyst layer. The metal-containing catalyst layer catalyzes deposition of the conformal silicon oxide film 104 on the substrate 1. This catalytic effect is observed until no catalytic sites are available for reaction, thereafter the silicon oxide deposition stops. In some examples, the metal-containing catalyst layer catalyzes deposition of about 10-15 nm of silicon oxide. The coating and exposing steps may be repeated at least once to increase a thickness of the silicon oxide film 104.

The silicon oxide film 104 may be stress-tuned to optimize the materials properties of the silicon oxide film 104. According to one embodiment, a substrate temperature may be selected that yields a desired level of compressive stress or tensile stress in the silicon oxide film 104 during the silicon oxide deposition. Furthermore, a substrate temperature may be selected that yields a substantially unstressed silicon oxide film 104.

Figure 3:
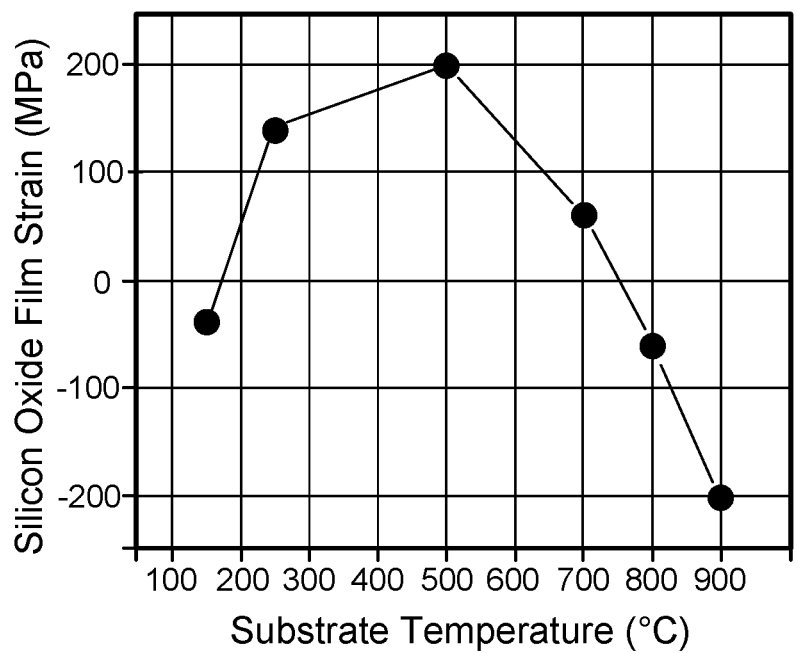
FIG. 3 shows measured silicon oxide film stress as a function of substrate temperature during the silicon oxide film deposition.

FIG. 3 shows measured silicon oxide film stress as a function of substrate temperature during the silicon oxide film deposition. The film stress was measured post-deposition at room temperature. The silicon oxide films were deposited on flat silicon wafers using alternating gas exposures of $AlMe_3$ and TPSOL. The film stress results show that when the substrate temperature was between about 200° C. and about 750° C., the silicon oxide films had tensile stress, whereas when the substrate temperature was less than about 200° C. or greater than about 750° C., the silicon oxide films had compressive stress. Further, the silicon oxide films were unstressed when the substrate temperature was about 200° C. or about 750° C. This allows for depositing silicon oxide films that are tensile stressed, compressively stressed, or unstressed, by simply selecting the substrate temperature.

Physical stress in the silicon oxide film 104 may further be tuned by adding dopants to the film, for example a metal. The metal can, for example, include Al, Hf, or Ti. In one example, a laminate of alternating films of a silicon oxide and a metal oxide may be used. The metal oxide can, for example, contain $TiO_2$, $Al_2O_3$, $HfO_2$, $ZrO_2$, or a combination thereof. The laminate may be formed by first depositing a silicon oxide film 104 by sequential exposures to a metal-containing catalyst and a silanol gas, as described above, followed by deposition of a metal oxide film, and repeating the deposition steps if desired. The metal oxide film may be deposited by exposing the substrate to a metal-containing precursor (e.g., Ti-containing, Al-containing, Hf-containing, or Zr-containing precursor), followed by exposing the substrate to an oxidizer (e.g., $O_2$ or $H_2O$). In one example a $(SiO_2/Al_2O_3)_5$ laminate was formed on a substrate by performing two cycles of $SiO_2$ deposition, ten cycles of $Al_2O_3$ deposition, and repeating the sequential $SiO_2$ and $Al_2O_3$ deposition five times. The resulting $(SiO_2/Al_2O_3)_5$ laminate was measured to have tensile stress of about 10 MPa. For comparison, a $SiO_2$ film deposited using 2 cycles of $SiO_2$ deposition had compressive stress of about 50 MPa. In another example, the silicon oxide film 104 may be doped (mixed) with a metal by sequential exposures to a metal-containing catalyst, a metal-containing precursor (e.g., Ti-containing, Al-containing, Hf-containing, or Zr-containing precursor) and a silanol gas. The sequential exposure steps may be performed until the doped silicon oxide film 104 has a desired thickness.

Figure 1C:
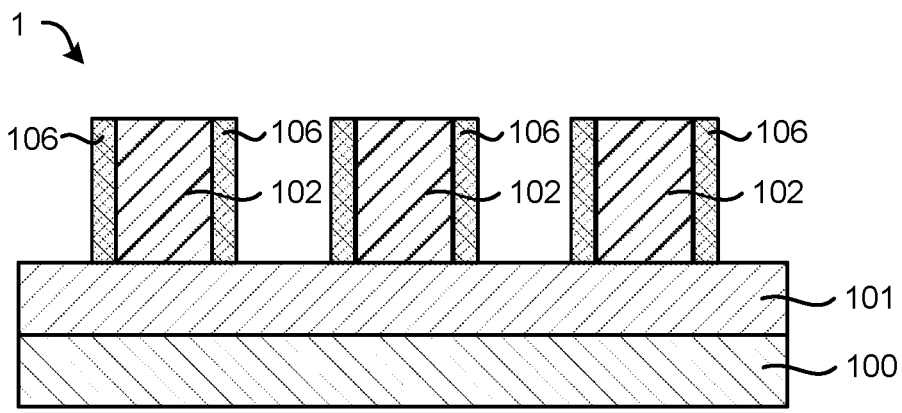

Referring to FIG. 1C, the method further includes removing the silicon oxide film 104 from upper surfaces of the mandrel pattern 102 and lower surfaces adjacent the mandrel pattern 102 to leave behind the silicon oxide film 104 on sidewalls of the mandrel pattern 102 to form silicon oxide sidewall spacers 106. The silicon oxide film 104 may be removed using fluorocarbon and hydrocarbon etch gases, for example using $CF_4$, $CH_4$, or $CH_3F$.

Figure 1D:
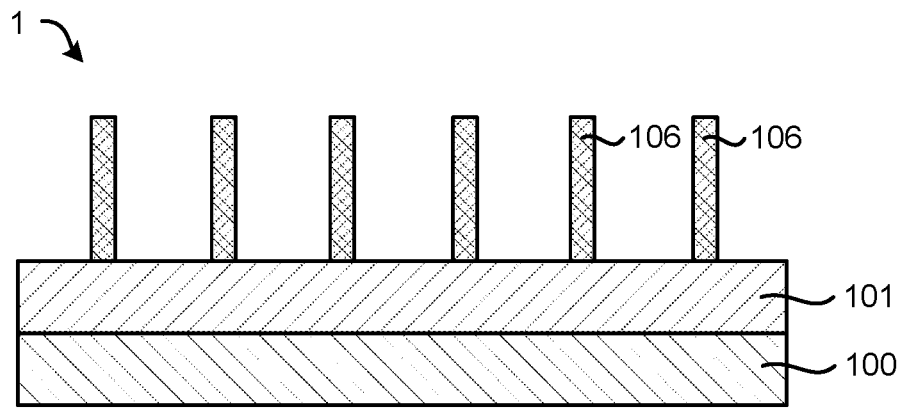

Referring to FIG. 1D, the method further includes removing the mandrel pattern 102 from the substrate 1 to leave behind the silicon oxide sidewall spacers 106, where the silicon oxide sidewall spacers 106 form a new pattern having double the number of features of the removed mandrel pattern 102. In one example, a mandrel pattern 102 containing amorphous carbon or a photoresist polymer may be selectively removed using plasma-excited $O_2$ gas. Removal of the mandrel pattern 102 can result in sideways leaning of the silicon oxide sidewall spacers 106. However, according to embodiments of the invention, physical stress formed in the silicon oxide sidewall spacers 106 may be tuned during the deposition of the silicon oxide film 104 that results in straighter vertical profiles (less sideways leaning) of the silicon oxide sidewall spacers 106. This allows for improved pattern transfer to the base layer 101 underneath the silicon oxide sidewall spacers 106.

Figure 1E:
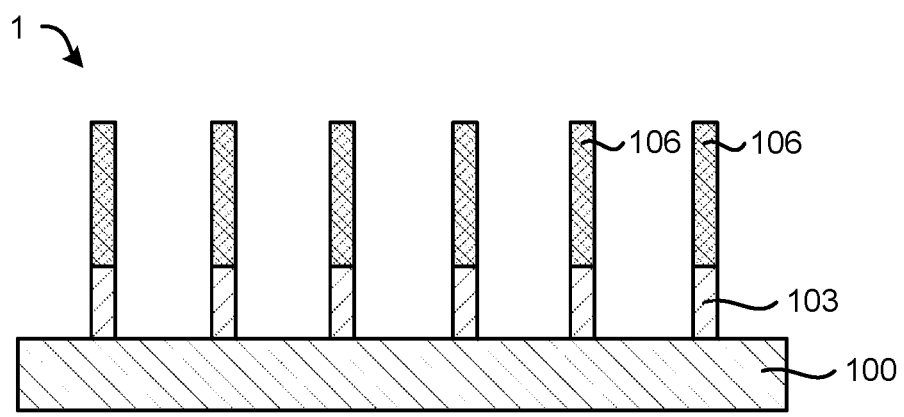

Referring to FIG. 1E, the method further includes transferring the new pattern of the silicon oxide sidewall spacers 106 into the base layer 101, thereby forming etched features 103 in the base layer 101. In one example, an anisotropic gas phase etching process using a plasma-excited etch gas may be used for the transfer.

Figure 1F:
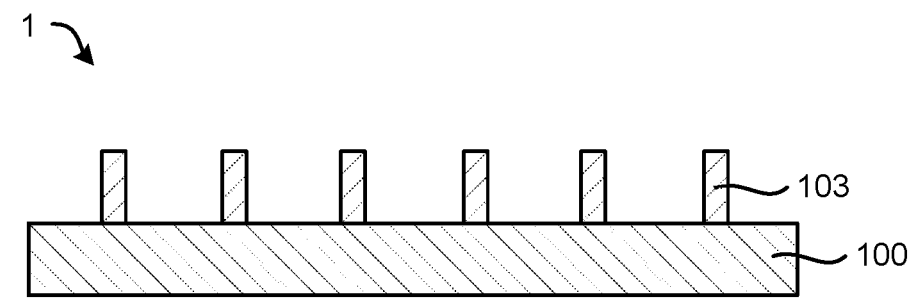

Referring to FIG. 1F, the method further includes the removing the silicon oxide sidewall spacers 106 from the substrate. The silicon oxide sidewall spacers 106 may be selectively removed using fluorocarbon and hydrocarbon etch gases, for example using $CF_4$, $CH_4$, or $CH_3F$.

FIGS. 2A-2F schematically show through cross-sectional views a method of processing a substrate according to an embodiment of the invention. The substrate 1 in FIG. 1D has be reproduced as substrate 2 in FIG. 2A and contains the new pattern of silicon oxide sidewall spacers 106 on the base layer 101.

Figure 2A:
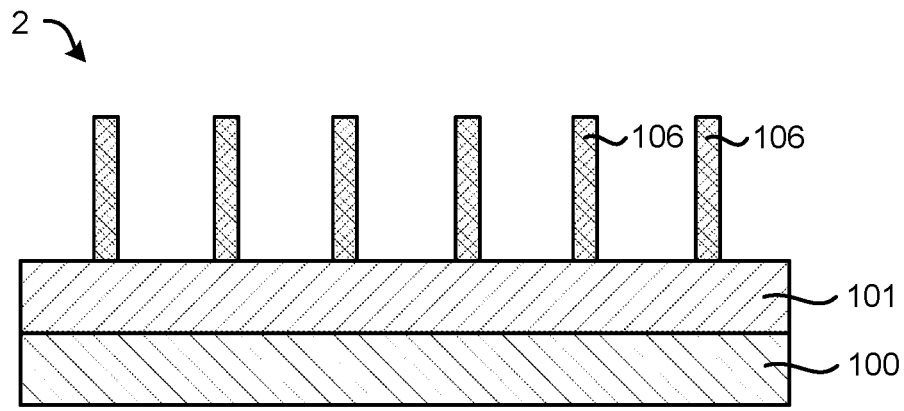
FIGS. 2A-2F schematically show through cross-sectional views a method of processing a substrate according to an embodiment of the invention.
Figure 2B:
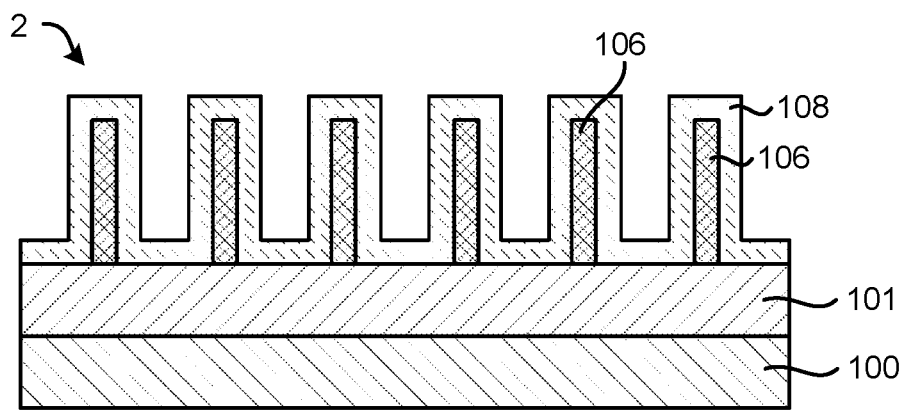

Referring to FIG. 2B, the method further includes conformally depositing a metal oxide film 108 over the new pattern of the silicon oxide sidewall spacers 106. The metal oxide film 108 may contain $TiO_2$, $Al_2O_3$, $HfO_2$, $ZrO_2$, or a combination thereof. The metal oxide film 108 may be deposited as described above. Physical stress properties of the metal oxide film 108 may be controlled by the processing conditions used during the deposition of the metal oxide film 108. Further, the physical stress in the metal oxide film 108 may be affected by the physical stress in the silicon oxide sidewall spacers 106 due to lattice matching between the metal oxide film 108 and the silicon oxide sidewall spacers 106. The physical stress can affect etch selectivity relative to other materials on the substrate, LER and LWR.

Figure 2C:
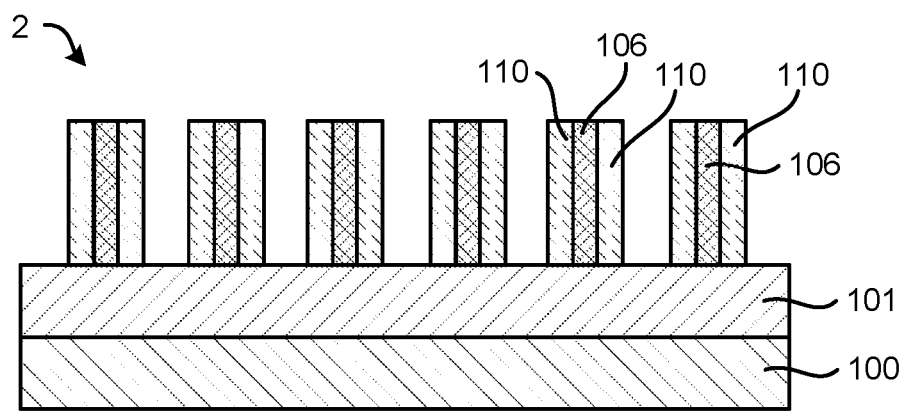

Referring to FIG. 2C, the method further includes removing the metal oxide film 108 from upper surfaces of the new pattern and lower surfaces adjacent the new pattern to leave behind the metal oxide film 108 on the sidewalls of the new pattern, thereby forming metal oxide sidewall spacers 110.

Figure 2D:
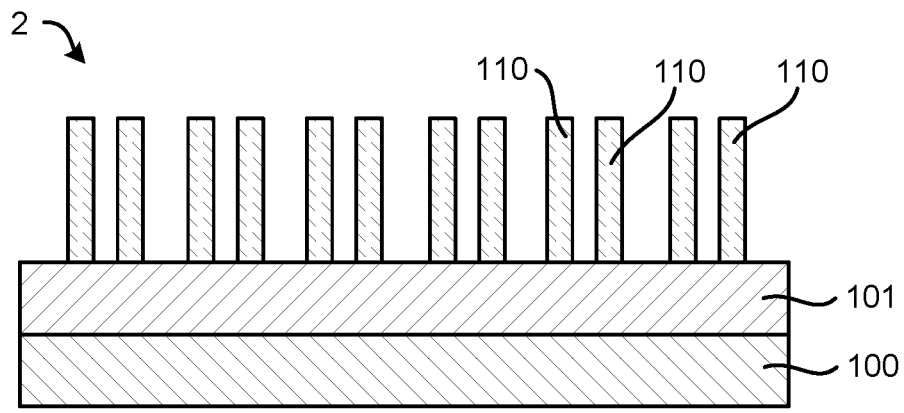

Referring to FIG. 2D, the method further includes selectively removing the new pattern of the silicon oxide sidewall spacers 106 from the substrate 2 to leave behind the metal oxide sidewall spacers 110 that form a second new pattern having double the number of features of the removed new pattern. The silicon oxide sidewall spacers 106 may be selectively removed using a gas phase etching process that is selective to etching silicon oxide relative to metal oxide.

Figure 2E:
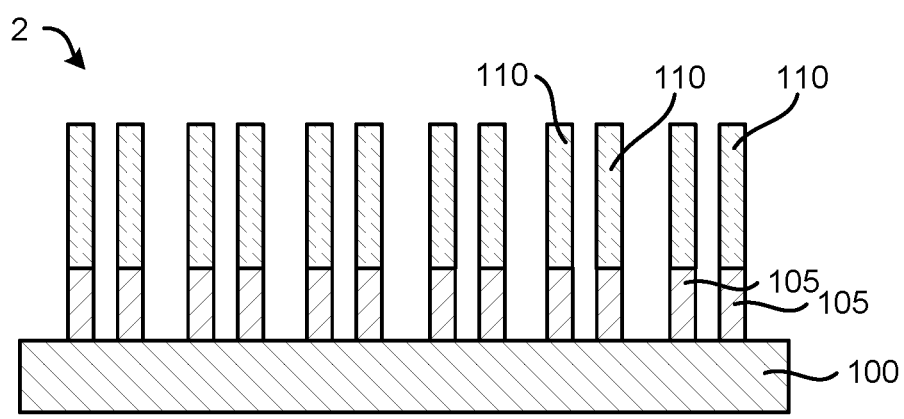

Referring to FIG. 2E, the method further includes transferring the second new pattern of the metal oxide sidewall spacers 110 into the base layer 101, thereby forming etched features 105 in the base layer 101. In one example, an anisotropic gas phase etching process using a plasma-excited etch gas may be used for the transfer.

Figure 2F:
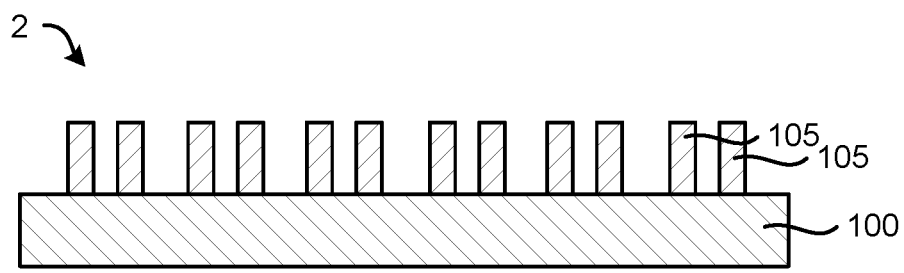

Referring to FIG. 2F, the method further includes removing the metal oxide sidewall spacers 110 from the substrate 2.

FIGS. 4A-4F schematically show through cross-sectional views a method of processing a substrate according to an embodiment of the invention. The substrate 1 in FIG. 1B has been reproduced as substrate 4 in FIG. 4A and contains a silicon oxide film 104 deposited over a mandrel pattern 102.

Figure 4A:
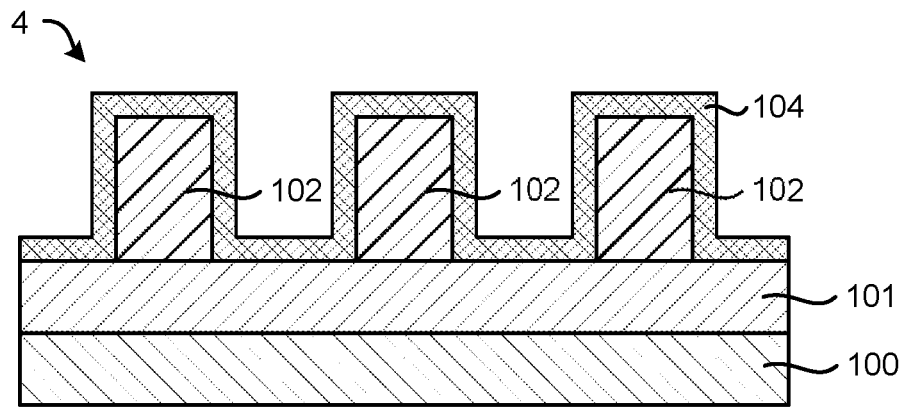
FIGS. 4A-4F schematically show through cross-sectional views a method of processing a substrate according to an embodiment of the invention.
Figure 4B:
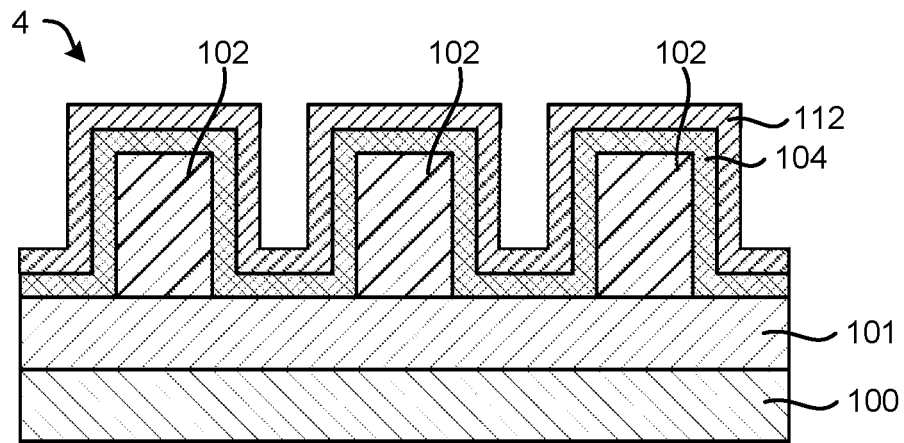

Referring to FIG. 4B, the method further includes depositing a metal oxide film 112 on the silicon oxide film 104. The metal oxide film 112 may contain $TiO_2$, $Al_2O_3$, $HfO_2$, $ZrO_2$, or a combination thereof. The metal oxide film 112 may be deposited as described above. The presence of the silicon oxide film 104 on the substrate 4 protects the mandrel pattern 102 from damage during the deposition of the metal oxide film 112, which may use an oxidizer, a plasma, or both. Physical stress properties of metal oxide film 112 may be controlled by the processing conditions during the deposition of the metal oxide film 112. Further, the physical stress in the metal oxide film 112 may be affected by the physical stress in the silicon oxide film 104 due to lattice matching between the metal oxide film 112 and the silicon oxide film 104. The physical stress can affect etch selectivity relative to other materials on the substrate, LER and LWR.

Figure 4C:
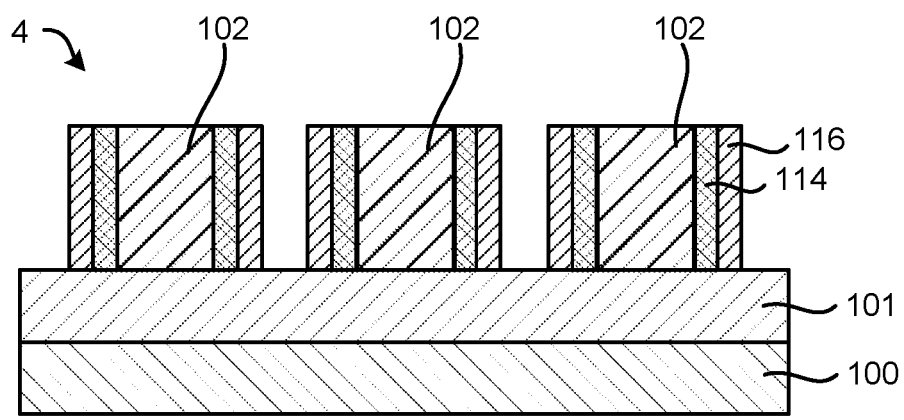

Referring to FIG. 4C, the method further includes removing the metal oxide film 112 and the silicon oxide film 104 from upper surfaces of the mandrel pattern 102 and lower surfaces adjacent the mandrel pattern 102 to leave behind the metal oxide film 112 on the silicon oxide film 104 on sidewalls of the mandrel pattern 102 thereby forming metal oxide sidewall spacers 116 and silicon oxide sidewall spacers 114.

Figure 4D:
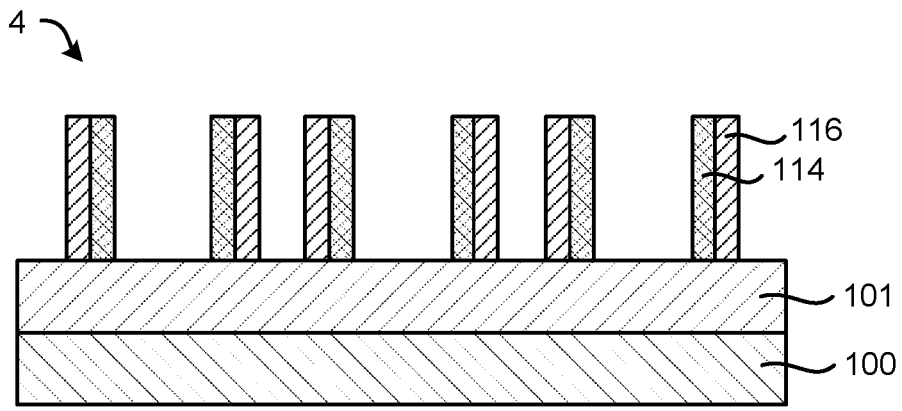

Referring to FIG. 4D, the method further includes removing the mandrel pattern 102 from the substrate 4 to leave behind the metal oxide sidewall spacers 116 and silicon oxide sidewall spacers 114, where the metal oxide sidewall spacers 116 and silicon oxide sidewall spacers 114 form a new pattern having double the number of features of the removed mandrel pattern 102.

Figure 4E:
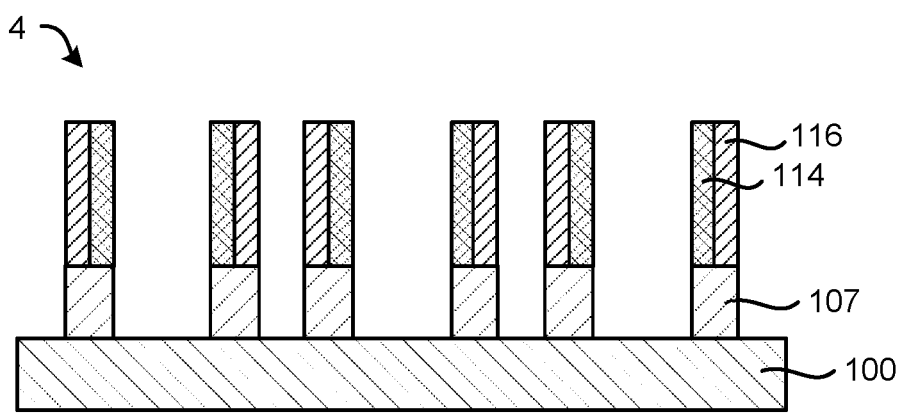

Referring to FIG. 4E, the method further includes transferring the new pattern of the metal oxide sidewall spacers 116 and silicon oxide sidewall spacers 114 into the base layer 101, thereby forming etched features 107 in the base layer 101. In one example, an anisotropic gas phase etching process using a plasma-excited etch gas may be used for the transfer.

Figure 4F:
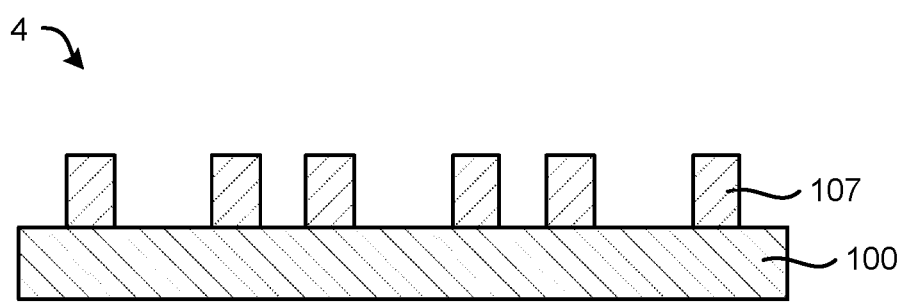

Referring to FIG. 4F, the method further includes removing the metal oxide sidewall spacers 116 and silicon oxide sidewall spacers 114 from the substrate 4.

A method for forming and using stress-tuned silicon oxide films as sidewall spacers in semiconductor device patterning been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for processing a substrate, the method comprising:
   receiving a substrate containing a base layer having a mandrel pattern formed thereon containing a number of features;
   conformally depositing a silicon oxide film over the mandrel pattern by
   coating surfaces of the substrate with a metal-containing catalyst layer, and
   in the absence of any oxidizing and hydrolyzing agent, exposing the substrate to a process gas containing a silanol gas at a substrate temperature that is selected to yield a preferred level of stress in the silicon oxide film;
   repeating the coating and exposing steps at least once to increase a thickness of the silicon oxide film;
   removing the silicon oxide film from upper surfaces of the mandrel pattern and lower surfaces adjacent the mandrel pattern to leave behind silicon oxide sidewall spacers on sidewalls of the mandrel pattern;
   removing the mandrel pattern from the substrate to leave behind the silicon oxide sidewall spacers that form a new pattern having double the number of features of the removed mandrel pattern;
   conformally depositing a metal oxide film on the new pattern;
   removing the metal oxide film from upper surfaces of the new pattern and lower surfaces adjacent the new pattern to leave behind metal oxide sidewall spacers on sidewalls of the new pattern; and
   removing the silicon oxide sidewall spacers from the substrate to leave behind the metal oxide sidewall spacers that form a second new pattern having double the number of features of the removed new pattern.

2. The method of claim 1, wherein the substrate temperature is between about 200° C. and about 750° C. and the silicon oxide film has tensile stress.

3. The method of claim 1, wherein the substrate temperature is less than about 200° C. or greater than about 750° C. and the silicon oxide film has compressive stress.

4. The method of claim 1, wherein the substrate temperature is about 200° C. or about 750° C. and the silicon oxide film is unstressed.

5. The method of claim 1, wherein the the metal-containing catalyst layer is selected from the group consisting of Al, $Al_2O_3$, AlN, AlON, an Al-containing precursor, Al-alloys, CuAl, TiAlN, TaAlN, Ti, TiAlC, $TiO_2$, TiON, TiN, a Ti-containing precursor, Ti-alloys, a Hf containing precursor, a Zr-containing precursor, and combinations thereof.

6. The method of claim 1, wherein the silanol gas is selected from the group consisting of tris(tert-pentoxy) silanol (TPSOL), tris(tert-butoxy) silanol, and bis(tert-butoxy)(isopropoxy) silanol.

7. The method of claim 1, wherein the silicon oxide film forms a mixture with a metal oxide containing $TiO_2$, $Al_2O_3$, $HfO_2$, $ZrO_2$, or a combination thereof.

8. The method of claim 1, wherein the preferred level of stress in the silicon oxide film improves the vertical profiles of the silicon oxide sidewall spacers.

9. The method of claim 1, wherein the metal oxide film contains $TiO_2$, $Al_2O_3$, $HfO_2$, $ZrO_2$, or a combination thereof.

10. The method of claim 1, further comprising:
    transferring the second new pattern into the base layer; and
    removing the metal oxide sidewall spacers from the substrate.

11. A method for processing a substrate, the method comprising:
    receiving a substrate containing a base layer having a mandrel pattern formed thereon comprising a number of features;
    conformally depositing a silicon oxide film over the mandrel pattern by:
    coating surfaces of the substrate with a metal-containing catalyst layer, and
    in the absence of any oxidizing and hydrolyzing agent, exposing the substrate to a process gas containing a silanol gas at a substrate temperature that is selected to yield a preferred level of stress in the silicon oxide film;
    conformally depositing a metal oxide film on the silicon oxide film;
    thereafter, removing the metal oxide film and the silicon oxide film from upper surfaces of the mandrel pattern and lower surfaces adjacent the mandrel pattern to leave behind metal oxide sidewall spacers and silicon oxide sidewall spacers on sidewalls of the mandrel pattern; and
    removing the mandrel pattern from the substrate to leave behind the metal oxide sidewall spacers and the silicon oxide sidewall spacers that form a new pattern having double the number of features of the removed mandrel pattern.

12. The method of claim 11, wherein the substrate temperature is between about 200° C. and about 750° C. and the silicon oxide film has tensile stress.

13. The method of claim 11, wherein the substrate temperature is less than about 200° C. or greater than about 750° C. and the silicon oxide film has compressive stress.

14. The method of claim 11, wherein the substrate temperature is about 200° C. or about 750° C. and the silicon oxide film is unstressed.

15. The method of claim 11, wherein the the metal-containing catalyst layer is selected from the group consisting of Al, $Al_2O_3$, AlN, AlON, an Al-containing precursor, Al-alloys, CuAl, TiAlN, TaAlN, Ti, TiAlC, $TiO_2$, TiON, TiN, a Ti-containing precursor, Ti-alloys, a Hf containing precursor, a Zr-containing precursor, and combinations thereof.

16. The method of claim 11, wherein the silanol gas is selected from the group consisting of tris(tert-pentoxy) silanol (TPSOL), tris(tert-butoxy) silanol, and bis(tert-butoxy)(isopropoxy) silanol.

17. The method of claim 11, wherein the metal oxide film contains $TiO_2$, $Al_2O_3$, $HfO_2$, $ZrO_2$, or a combination thereof.

18. The method of claim 11, further comprising:
    transferring the new pattern into the base layer; and
    removing the metal oxide sidewall spacers and the silicon oxide sidewall spacers from the substrate.

19. A method for processing a substrate, the method comprising:
    receiving a substrate containing a base layer having a mandrel pattern formed thereon containing a number of features;
    conformally depositing a silicon oxide film over the mandrel pattern by
    coating surfaces of the substrate with a metal-containing catalyst layer, and
    in the absence of any oxidizing and hydrolyzing agent, exposing the substrate to a process gas containing a silanol gas at a substrate temperature that is selected to yield a preferred level of stress in the silicon oxide film;

removing the silicon oxide film from upper surfaces of the mandrel pattern and lower surfaces adjacent the mandrel pattern to leave behind silicon oxide sidewall spacers on sidewalls of the mandrel pattern;

removing the mandrel pattern from the substrate to leave behind the silicon oxide sidewall spacers that form a new pattern having double the number of features of the removed mandrel pattern;

conformally depositing a metal oxide film on the new pattern;

removing the metal oxide film from upper surfaces of the new pattern and lower surfaces adjacent the new pattern to leave behind metal oxide sidewall spacers on sidewalls of the new pattern; and removing the silicon oxide sidewall spacers from the substrate to leave behind the metal oxide sidewall spacers that form a second new pattern having double the number of features of the removed new pattern.

20. The method of claim 19, wherein the metal oxide film contains $TiO_2$, $Al_2O_3$, $HfO_2$, $ZrO_2$, or a combination thereof.

* * * * *